US006798289B2

(12) United States Patent
McGinn

(10) Patent No.: US 6,798,289 B2
(45) Date of Patent: Sep. 28, 2004

(54) SYSTEM, APPARATUS AND METHOD FOR VOLTAGE TO CURRENT CONVERSION

(75) Inventor: Michael McGinn, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/160,348

(22) Filed: May 31, 2002

(65) Prior Publication Data

US 2003/0222714 A1 Dec. 4, 2003

(51) Int. Cl.[7] .................................................. H03F 3/45
(52) U.S. Cl. ........................ 330/252; 330/261; 455/214
(58) Field of Search ................................. 330/252, 261; 455/214

(56) References Cited

U.S. PATENT DOCUMENTS 4,147,971 A * 4/1979 Price .......................... 330/261
4,555,673 A * 11/1985 Huijsing et al. ............ 330/258
4,965,528 A * 10/1990 Okanobu .................... 330/261
5,950,118 A * 9/1999 Freeburg et al. ............ 455/214

FOREIGN PATENT DOCUMENTS

EP 071131 A1 * 5/1996

OTHER PUBLICATIONS

Maudy et al. "Cross Coupled Transconductance Cell with Improved Linearity Range" The 2000 IEEE International Symposium on Circuits and Systems, vol. 5, May 28–31, 20 pp 157–160.*

* cited by examiner

*Primary Examiner*—Michael B Shingleton
(74) *Attorney, Agent, or Firm*—Toler, Larson & Abel, LLP

(57) ABSTRACT

A voltage-to-current converter having improved third order distortion is disclosed herein for use in an FM radio system, particularly an FM radio system which employs a broadband input filter rather than a narrow band input filter. By cross-coupling a main amplifier with a second amplifier that produces more distortion and has a smaller $g_m$, than the main amplifier, third order frequency peaks resulting from non-linear amplification of undesired signals can be prevented from interfering with a desired signal because the magnitude of the third order frequency peak is reduced.

32 Claims, 5 Drawing Sheets

-PRIOR ART-

SYSTEM, APPARATUS AND METHOD FOR VOLTAGE TO CURRENT CONVERSION

FIELD OF THE DISCLOSURE

This invention relates generally to voltage to current converters.

BACKGROUND

Radio signals can include many different frequency components that are commonly referred to as channels. Usually, it is desired to select and isolate one particular channel for analog processing to be delivered to a speaker, or similar device, so that the information contained in the selected channel can be perceived by a listener as sound. In order to isolate the selected channel, radio receivers are tuned to a particular frequency, which corresponds to the selected channel.

Tuning a radio receiver requires that circuitry within the radio receiver be configured to respond primarily to a frequency corresponding to the selected channel. In earlier radio systems, tuning the radio receiver included tuning a narrow-band radio-frequency (RF) filter near the antenna input to filter the radio signal prior to that signal being amplified. The narrow filtering provided by the narrow-band filter removed essentially all frequencies from the radio signal, except for a very narrow band of frequencies around the selected channel. Passing only the frequency used for the selected channel provided for a relatively high degree of selectivity, and allowed the filtered signal to be amplified by relatively simple amplifiers.

Narrow-band RF filters, while providing good selectivity, have the disadvantage of adding expense and complexity to the radio receiver, since tuning of the narrow-band filter must be precisely coordinated with the tuning of other circuitry within the radio for optimum performance. The precise tuning requirements of narrow-band filters often require more parts with close tolerances, which can significantly add to the cost of building a radio receiver. In order to reduce the complexity and expense associated with using narrow-band filters, manufacturers have more recently begun specifying that broadband filters should be used at the antenna input in place of narrow-band filters.

The cost saving measure of using broadband filters brings with it a new set of challenges, however. Because unwanted frequencies surrounding the selected channel are not completely filtered out, greater demands are placed on subsequent portions of the radio receiver to be able to deal with extraneous frequencies and unwanted channels. For example, if a voltage-to-current converter normally used on the input to a mixer of a heterodyne receiver is not linear, additional undesired frequency components may be generated, which make it difficult for the processing circuitry to distinguish between frequency peaks associated with a desired channel, and unwanted frequency components. Prior art FIG. 1 illustrates this problem.

Prior art FIG. 1 shows a desired signal 140, a first adjacent signal 110 and a second adjacent signal 120 which are all passed through a broadband filter. It will be appreciated that generally the broadband filtering will be centered about the wanted signal 140, and that for purposes of illustration that one or more adjacent signals will generally exist on both sides of the wanted signal 140. However, for purposes of discussion, only the adjacent signals on one side of the wanted signal 140 are illustrated. In older radio systems which employ a narrow-band filter, first adjacent signal 110 and second adjacent signal 120 would be filtered out, but this is not the case when using a broadband filter. When a mixer with a voltage-to-current converter is presented with a radio signal that includes adjacent signals, such as first and second adjacent signals 110 and 120, third order signals 130 and 132 will be produced. Third order signals 130 and 132 associated with the first and second adjacent signals are unwanted artifacts produced because of non-linearities in the voltage-to-current converter that correspond to the third term in a power series equation. These third order signals, see third order signal 130, can reside at a frequency close enough to the frequency of the wanted signal 140 to cause distortion and interference. Subsequent narrow band filters in the radio circuitry will filter out first adjacent signal 110, second adjacent signal 120 and third order signal 132 without too much difficulty, because these signals have frequencies that are substantially different from wanted signal 140. However, the narrow band filters may have difficulty filtering out third order signal 130, because it is so close in frequency to wanted signal 140.

In order to make voltage-to-current converters more linear, and thereby reduce the magnitude of third order signals 130 and 132, some prior art converters have employed feedback amplifiers and diode cancellation circuits. However, these prior art attempts to make voltage-to-current converters more linear work well only over a relatively small range of frequencies, and tend not to perform well at high frequencies due to phase shift problems. In addition, extra devices and resistors can degrade noise performance. Other voltage-to-current converters have used increased amounts of bias current to obtain a greater degree of linearity. Unfortunately, in many of today's mobile devices higher levels of bias current are impractical due to the power constraints imposed by portable power sources.

What is needed, therefore, is a voltage-to-current converter, that can be used in conjunction with broadband input filters. In particular, it would be clearly advantageous if a voltage-to-current converter could be made more linear to avoid or decrease problems with third order signals generated due to the non-linearity, while at the same time not introducing phase shift problems such as those introduced by some conventional voltage-to-current converters, degrade the overall noise figure of the receiver or use large bias currents to achieve the required linearity.

BRIEF DESCRIPTION OF THE DRAWINGS

Various advantages, features and characteristics of the present disclosure, as well as methods, operations and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 2–6 illustrate a frequency modulated (FM) radio receiver and a voltage-to-current converter used therein. In at least one embodiment the input to the voltage-to-current converter is received from a broadband filter, which does not filter out all frequency components adjacent to a desired channel's frequency. The voltage-to-current converter employs a main differential amplifier and a cancellation differential amplifier to produce an output having reduced third order distortion components. The output of the voltage-to-current current converter is fed into a mixer where the signal is mixed with a signal from a local oscillator to produce an intermediate frequency (IF) which is then filtered, amplified, and demodulated to produce an audio output. The voltage-to-current converter described in at least one embodiment does not introduce unacceptable phase shifts nor excessive non-linearities when used in radio receivers.

Figure 1:
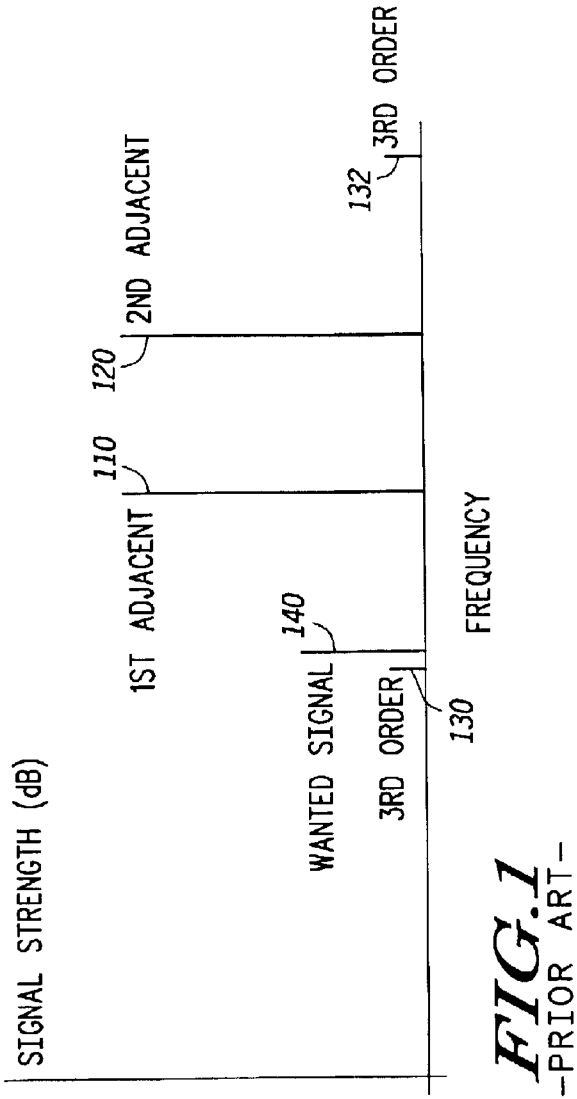
FIG. 1 is a prior art graph illustrating how third order distortion produced by voltage-to-current converter non-linearity can interfere with a desired signal.
Figure 2:
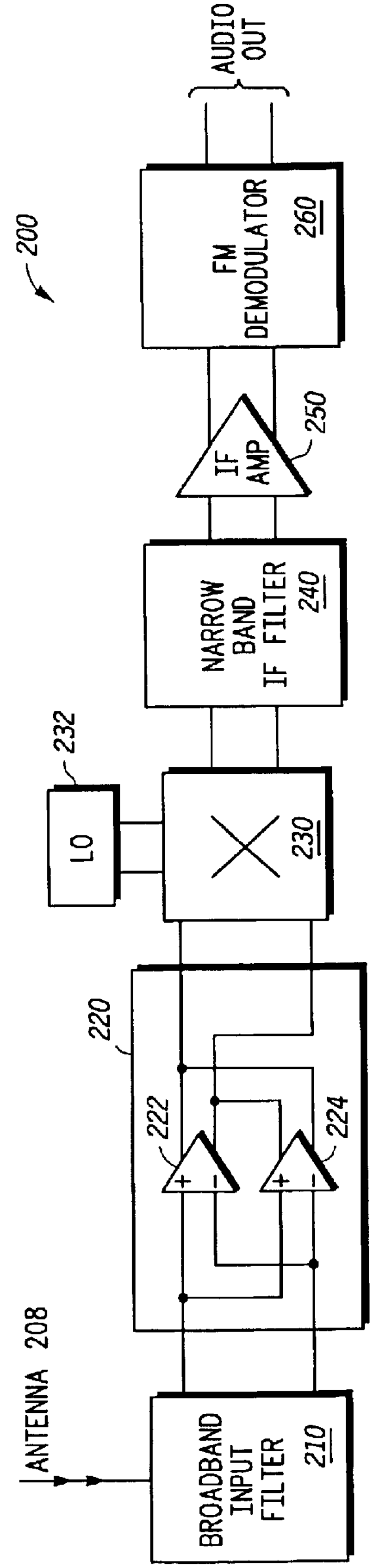
FIG. 2 is a block diagram of a radio receiver according to an embodiment of the present invention.

Referring now to FIG. 2, an FM radio receiver will be discussed according to one embodiment of the present invention. The FM radio receiver is designated generally as radio 200. Radio 200 includes an antenna 208, a broadband input filter 210, a voltage to current converter 220, a local oscillator 232, a mixer 230, a narrow band intermediate frequency (IF) filter 240, an IF amplifier 250 and an FM demodulator 260. In operation, broadband input filter 210 receives a radio signal from an antenna 208. The radio signal received from antenna 208 includes a number of channels corresponding to particular frequencies, including a desired channel, and a number of undesired channels.

Broadband input filter 210 filters out some of the undesired channels contained in the radio signal received from antenna 208. The channels filtered out by broadband input filter 210 include primarily channels corresponding to frequencies that are relatively distant from the frequency of the desired channel. However, frequency components from at least two adjacent channels are not completely filtered out by broadband input filter 210.

The filtered radio signal is passed from broadband input filter 210 to voltage-to-current converter 220. Voltage-to-current converter 220 linearly converts the filtered radio signal voltage to an output current and passes the output current to mixer 230. In order to achieve conversion without generating excessive third order distortion from the unwanted channels included in the filtered radio signal, voltage-to-current converter 220 employs two differential amplifiers with their outputs cross-coupled.

Main amplifier 222, which in the illustrated embodiment is a differential amplifier, performs a voltage-to-current conversion in a manner well known to those skilled in the art. Cancellation amplifier 224, which is also illustrated as a differential amplifier in FIG. 2, receives the same inputs as main amplifier 222, but the outputs of cancellation amplifier 224 are cross-coupled to the outputs of main amplifier 222. This means that the positive output of cancellation amplifier 224 is connected to the inverting output of main amplifier 222, while the inverting output of cancellation amplifier 224 is connected to the non-inverting output of main amplifier 224.

Both main amplifier 222 and cancellation amplifier 224 have a characteristic forward tansconductance ($g_m$), which is essentially a measure of how much the output current of the differential amplifier changes for a given change in the input voltage. The $g_m$ of main amplifier 222 is configured to be significantly larger than the $g_m$ of cancellation amplifier 224. In at least one embodiment, the $g_m$ of main amplifier 222 is approximately ten times greater than the $g_m$ of cancellation amplifier 224. In other embodiments, the $g_m$ of main amplifier 224 is configured to be between about five times and fifteen times greater than the $g_m$ of cancellation amplifier 224. If the ratio of the $g_m$ of main amplifier 222 to the $g_m$ of cancellation amplifier 224 is configured to be greater than 15:1, matching transistors within the differential amplifiers can become more of a problem. Conversely, if the ratio of the $g_m$ of main amplifier 222 to the $g_m$ of cancellation amplifier 224 is configured to be less than 5:1, significant signal loss of the wanted signal 140 may impact the effectiveness of the cross-coupling arrangement. It will be appreciated that according to the teachings set forth herein the ratio of the $g_m$ of main amplifier 222 to the $g_m$ of cancellation amplifier 224 can be configured outside the range stated herein, however it is anticipated that $g_m$ ratios lying outside of the stated ranges may be somewhat problematic.

In addition to configuring the $g_m$ of main amplifier 222 to be greater than the $g_m$ of cancellation amplifier 224, the amount of bias current supplied to each of the amplifiers is different. The bias current supplied to main amplifier 222 is greater than the amount of bias current supplied to cancellation amplifier 224. Because main amplifier 222 is supplied with greater bias current than cancellation amplifier 224, cancellation amplifier 224 will produce a greater relative amount of distortion than that produced by main amplifier 222. However, recall that the $g_m$ of main amplifier 222 is configured to be greater than the $g_m$ of cancellation amplifier 224. As a result, the ratio of the distortion to the desired signal produced in cancellation amplifier 224 is much greater than the ratio of the distortion of the desired signal in main amplifier 222. Therefore, when the distortion produced by cancellation amplifier 224 is effectively subtracted from the distortion produced by main amplifier 222 because of the cross-coupling, the end effect is that the output of voltage-to-current converter 220 has a significantly reduced amount of third order distortion produced by the undesired signals than would main op amp 222 without the cancellation provided by cancellation amp 224. The process of canceling out the undesired third order distortion, without significantly lowering the amount of desired signal, will be discussed subsequently in relation to FIGS. 4–6.

The output of voltage-to-current converter 220, which has a reduced amount of third order distortion, is then fed into mixer 230. Mixer 230 mixes the output of voltage-to-current converter 220 with the output of local oscillator 232 in a manner well known to those skilled in the art, to produce an intermediate frequency (IF) signal. This IF frequency signal is used by other circuitry within radio 200 to produce the audio output. The output of mixer 230, which still includes a desired channel, some undesired channels in a band around the desired channel, and some small amount of third order distortion is now passed to narrow-band IF filter 240.

Narrow band IF filter 240 removes undesired frequency components from the signal, except for any undesired frequencies that are too close to the desired channel. Recall that some third order distortion is normally close enough to the desired signal such that narrow band IF filter 240 does not completely remove it. Therefore, by the time the signal reaches narrow band IF filter 240 it is desirable that third order distortion have been previously removed or minimized so that the quality of the audio output of the radio will not be significantly affected. Recall also that due to the cross-coupling of main amplifier 222 and cancellation amplifier 224 in voltage-to-current converter 220, at least one embodiment of the present invention provides an output having a reduced amount of third order distortion.

After the signal leaves narrow band IF filter 240 it is fed into an IF amplifier 250. IF amplifier 250 amplifies the IF signal and provides it to an FM demodulator 260. The FM demodulator 260 separates the information in the signal from the carrier, and then processes the information into an audio output signal that can be delivered to speakers, equalizers, or other suitable signal handling circuitry or equipment (not shown).

Figure 3:
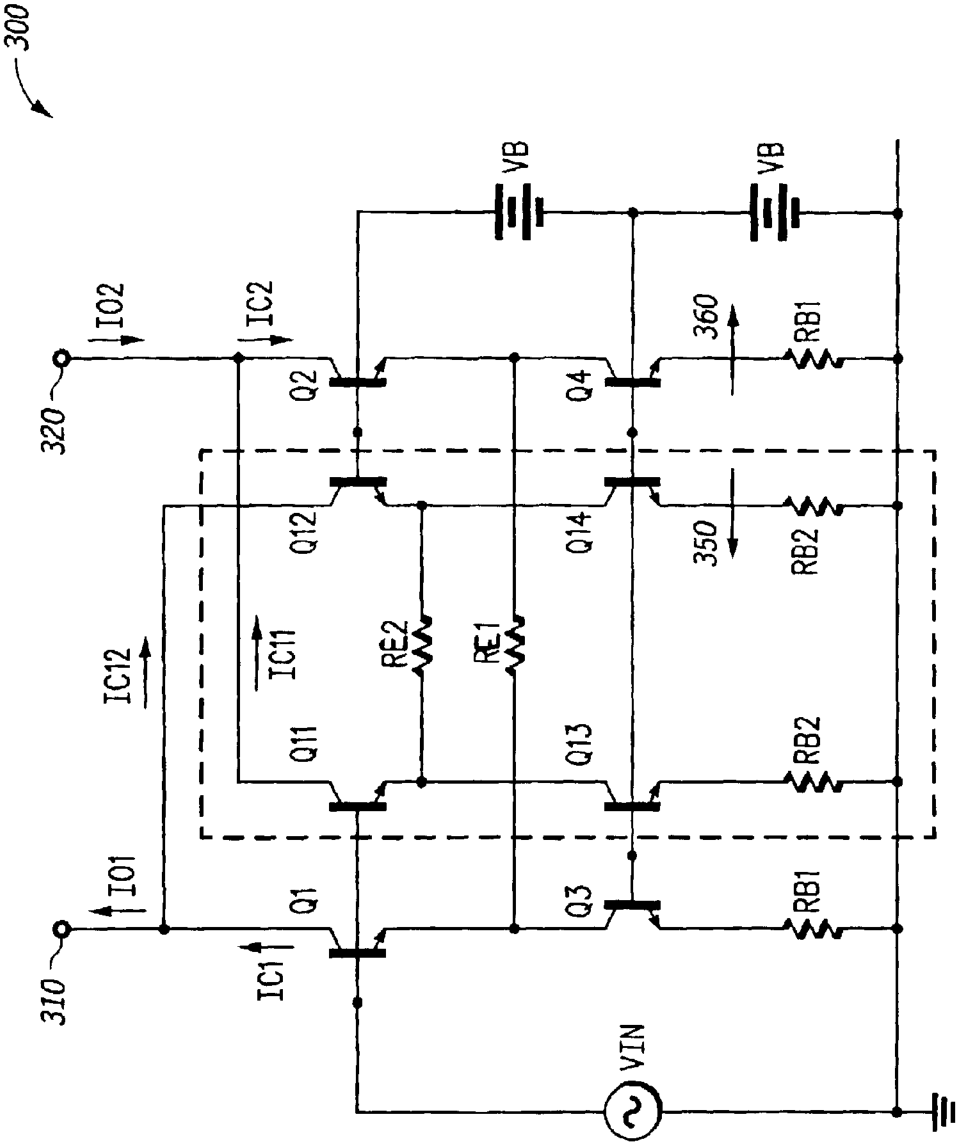
FIG. 3 is a schematic of a voltage-to-current converter/amplifier according to an embodiment of the present invention.

Referring next to FIG. 3 an embodiment of a voltage-to-current converter according to one embodiment of the present invention is illustrated and designated generally as converter 300. The input to converter 300 is Vin, which in at least one embodiment is the output of a broadband radio frequency filter as discussed in FIG. 2. In the illustrated embodiment, the transistors outside of the dotted line, Q1, Q2, Q3 and Q4 form main differential amplifier 360, and the transistors inside of the dotted lines, Q11, Q12, Q13 and Q14 form cancellation amplifier 350. Transistors Q3 and Q4, along with resistors RB1, form constant current tails for main amplifier 360, while transistors Q13, Q14 and resistors RB2 form constant current tails for cancellation amplifier 350. Constant current tails are well known to those skilled in the art, and so the following discussion will focus primarily on transistors Q1, Q2, Q11, Q12 and resistors RE2 and RE1. Proper biasing of the illustrated transistors using bias voltages VB is also well understood by those skilled in the art.

As discussed earlier, in order to achieve a decreased level of third order distortion at differential outputs 310 and 320 of converter 300, the $g_m$ of main amplifier 360 should be set to be greater than the $g_m$ of cancellation amplifier 350. The $g_m$ of main amplifier 360 is primarily governed by the value of resistor RE1, while the gain of cancellation amplifier 350 is primarily controlled by the value of resistor RE2. In at least one embodiment, main amplifier 360, which includes transistors Q1 and Q2, is configured to have a $g_m$ approximately ten times greater than the $g_m$ of cancellation amplifier 350, which includes transistors Q11 and Q12. To understand why this is necessary, consider the case where the $g_m$ of main amplifier 360 is the same as the $g_m$, of cancellation amplifier 350. Since the outputs of transistors Q11 and Q12 are cross-coupled to the outputs of transistors Q1 and Q2, any change in the collector current IC1 contributed by transistor Q1 would be cancelled out by the change in collector current IC12 contributed by transistor Q12. This would result in a net current out at both outputs 310 and 320 of zero, meaning that output current IO1 and output current IO2 would necessarily be zero, and any desired signal would be completely cancelled out along with the unwanted signals and the third order distortion.

However, by making the $g_m$ of cancellation amplifier 350 less than the $g_m$ of main amplifier 360, output current IO1, which is the sum of collector current IC1 from transistor Q1 and collector current IC12 from transistor Q12, is not necessarily a zero sum. Similarly, output current IO2 is the sum of collector current IC2 from transistor Q2 and IC11 from transistor Q11, and will also have a non-zero value, but will be 180 degrees out of phase with IO1. Note that as long as the ratio of $g_m$ between main amplifier 260 (which includes transistors Q1 and Q2) and cancellation amplifier 350 (which includes transistors Q11 and Q12) is greater than about 5:1, the amount of signal lost due to the cross-coupling should not significantly adversely affect the operation of converter 300.

Simply making the $g_m$, different, however, would have the same effect on a wanted signal as it had on the undesired third order distortion, and the ratio of the desired signal to the third order distortion at outputs 310 and 320 would not change. In order to improve the ratio of the desired signal to the third order distortion, we must reduce the amount of third order distortion in the output currents IO1 and IO2 more than we reduce the amount of the desired signal.

To accomplish this, the values of RE2 and RE1 are set to have a ratio of approximately 10:1, and the values of RB1 and RB2 are chosen to match the magnitude of the third level distortion components produced by main amplifier 360 and cancellation amplifier 350. The value of RB2 effectively sets the amount of bias current that flows through transistors Q11 and Q12, while the value of RB1 effectively sets the amount of bias current that flows through transistors Q1 and Q2. By making the value RB2 higher than the value of RB1, the amount of bias current in Q11 and Q12 is made correspondingly smaller than the amount of bias current that flows through transistors Q1 and Q2, thus increasing third order distortion in cancellation amplifier 350. Hence, by increasing the value of RB2 to RB1, the third order distortion in cancellation amplifier 350 can be increased until it is equal in magnitude to the third order distortion in amplifier 360. Note that although distortion in 350 and 360 can be made equal by controlling the bias currents, the $g_m$ of cancellation amplifier 350 is still much less than the $g_m$ of main amplifier 360 because the value of RE2 is much greater than the value of RE1.

Therefore, in addition to the ratio of RE1 to RE2, the ratio of resistors RB1 to RB2, which is selected to be consistent with the ration of RE1 to RE2, also plays a role in increasing the amount of distortion in cancellation amplifier 350 over the amount of distortion produced by main amplifier 360. Because RB1 has a smaller value that RB2, more current flows through transistors Q1 and Q2 than flows through transistors Q11 and Q12. A decrease in the amount of current flowing through a transistor increases the amount of third order distortion produced by a transistor. Therefore, the reduced amount of current flowing through transistors Q11 and Q12 increases the distortion generated by cancellation op amp 350 as compared to the amount of distortion produced by main amplifier 360. In at least one embodiment, the amount of current flowing through transistors Q11 and Q12 is approximately 18 times less than the amount of current flowing through transistors Q1 and Q2.

Having shown up to this point, that the gain of cancellation amplifier 350 is less than the gain of main amplifier 360, and that the amount of distortion produced by cancellation amplifier 350 is relatively less than the amount of distortion produced by main amplifier 360, it should be apparent that when the output of cancellation amplifier 350 is cross-coupled to the output of main amplifier 360, more of the third order distortion will be cancelled, and less of the desired signal will be cancelled, thereby resulting in an output with a reduced amount of third order distortion as compared to an amplifier without cancellation.

One of the significant advantages of constructing a voltage-to-current converter as discussed herein, is that the linearity of such a converter does not significantly change with temperature or signal amplitude, because the cancellation of third order components can be made dependent only on resistor ratios. In fact, near perfect cancellation of third order products can be achieved if the ratio of resistors RB2 and RB1 are set according to the following equation:

$$\frac{RB2}{RB1} \approx \left(\frac{RE2+2RE1}{2RE2+RE1}\right)^{\frac{4}{3}}$$

It will be appreciated that while FIG. 3 illustrates conventional bi-polar junction transistors (BJT), other transistors such as field effect transistors (FET) and the like may be used in implementing a converter according to the principles discussed herein. It will also be appreciated that while converter 300 shows the outputs of a main amplifier 360 and a cancellation amplifier 350 as being cross-coupled, in other embodiments the inputs of a main amplifier and a cancellation amplifier may be cross-coupled, while the outputs are coupled in parallel, thereby achieving the same or similar effect as that discussed with respect to FIG. 3.

Figure 4:
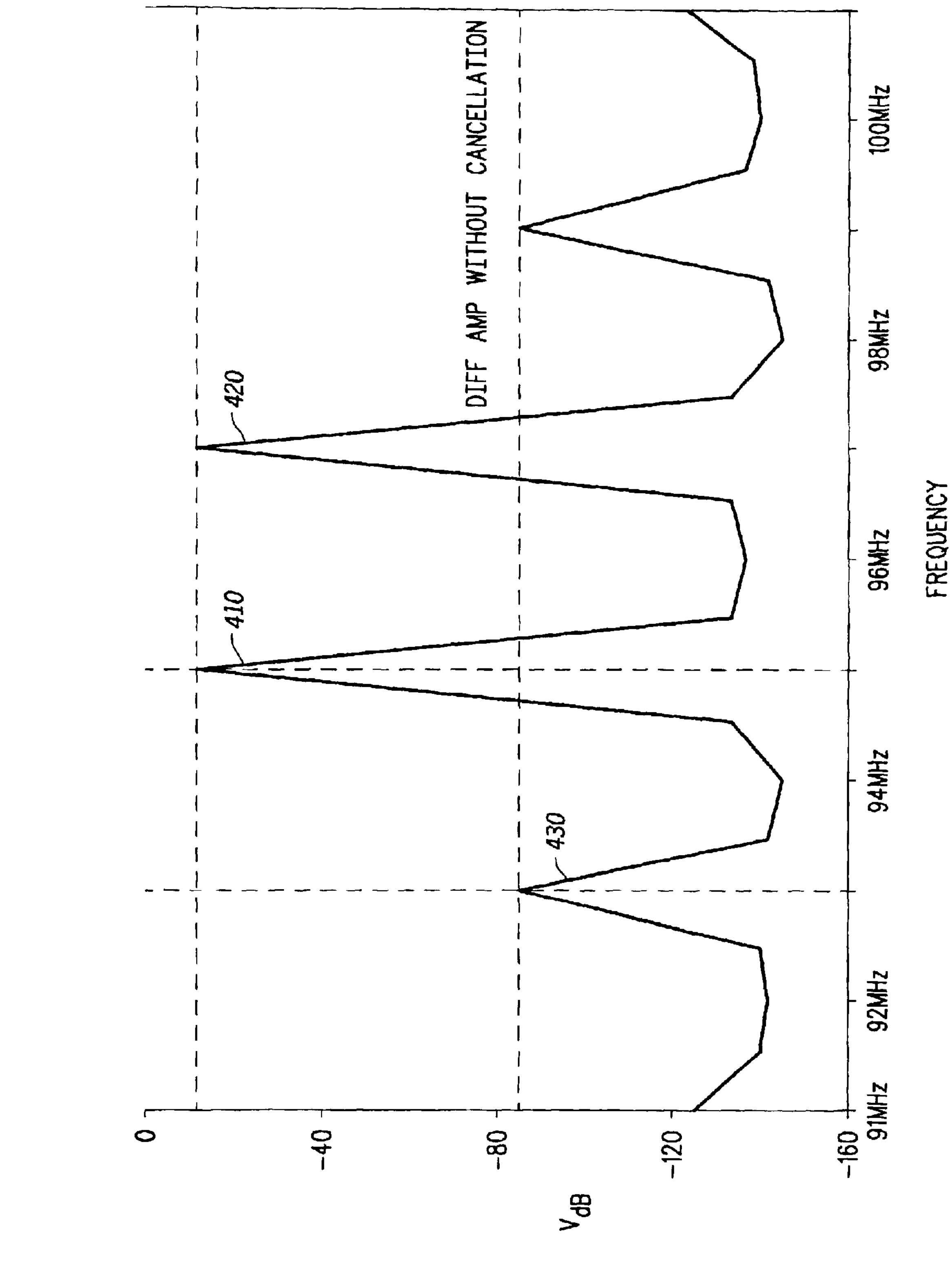
FIG. 4 is a graph illustrating the output of a main differential amplifier without cancellation according to an embodiment of the present invention.

Referring next to FIG. 4, the output signal of a differential amplifier without cancellation is illustrated. FIG. 4 shows the generation of third order frequency peak 430 due to amplification of two separate frequency peaks 410 and 420 by a non-linear amplifier. For ease of simulation and clarity of discussion, only two undesired frequency signals on one side of a desired signal were simulated. The desired signal was not included in the illustrated simulation, nor were additional undesired frequencies on the other side of the desired signal. If the desired signal were included in the simulation, it would be at the same frequency as third order frequency peak 430, and have the same amplitude as frequency peaks 410 and 420. Note also that while the graph of the simulation is shown with respect to voltage, the voltage was developed by a resistor across the output of a converter and is used only to assist in measuring the current output of a voltage-to-current converter. While the output is shown as a voltage level, the same relationship between the peaks holds true for the current output of a voltage-to-current converter.

The two frequency peaks 410 and 420 which represent undesired frequencies have an amplitude of approximately −14 db. Note that the value of peak 430 is approximately −85 db. As a result, the difference between frequency peaks 410 and 420 and third order frequency peak 430 is approximately 70 dB. As stated above, for purposes of this example the desired signal (not shown) will have an amplitude of approximately the same as the undesired signals and therefore the difference between the amplitude of a desired signal and third order frequency peak 430 as shown in FIG. 4 will also be approximately 70 db. At this point recall that although subsequent narrow-band filters can remove the large undesired frequency peaks 410 and 420 fairly easily, those same filters will not be able to so easily remove third order peak 430 without also affecting the wanted signal (not shown), because third order peak 430 is very close to the frequency of the desired signal (not shown).

Figure 5:
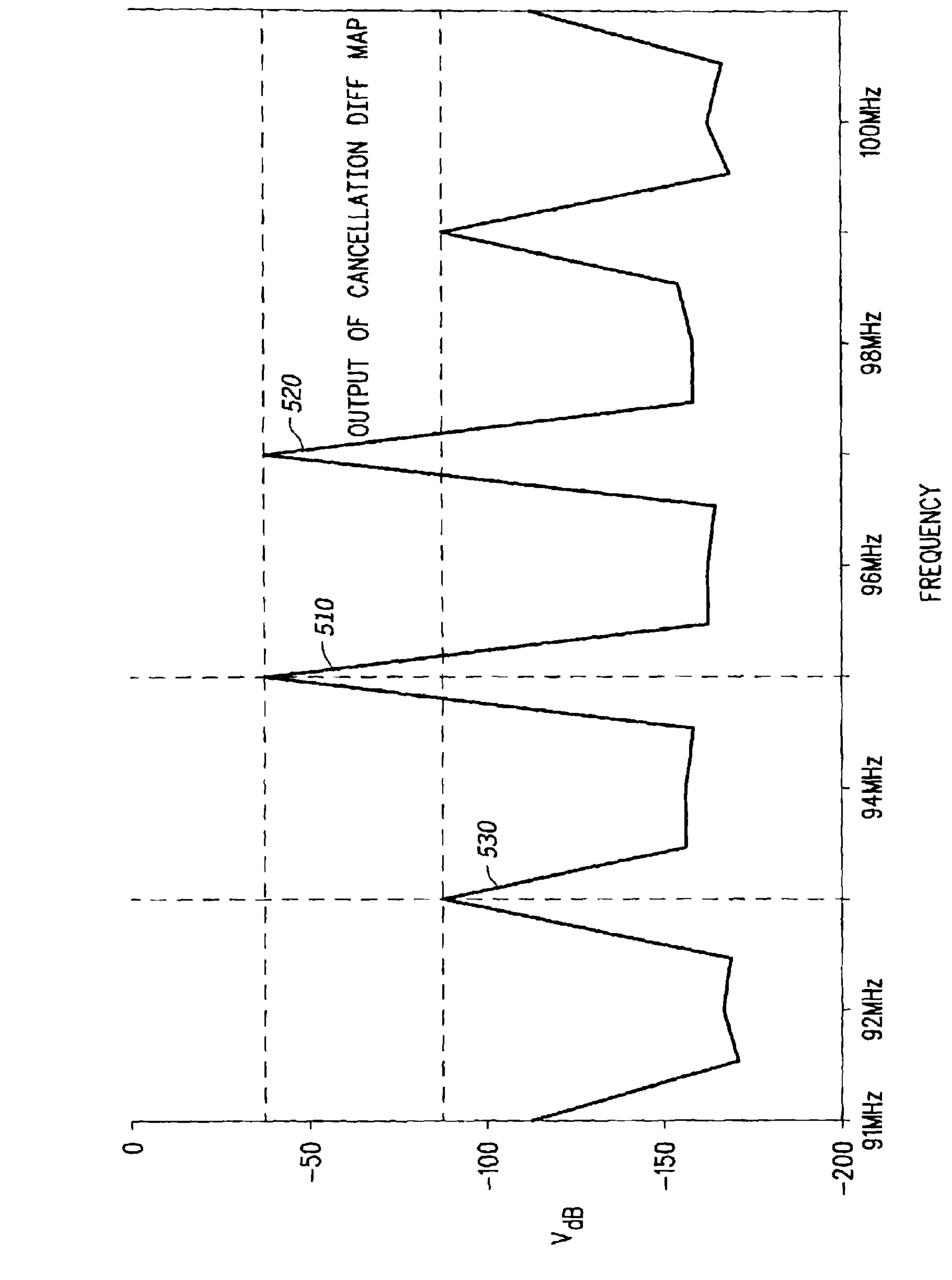
FIG. 5 is a graph illustrating the output of a cancellation differential amplifier according to an embodiment of the present invention.

Referring next to FIG. 5, the output of a cancellation differential amplifier is shown according to an embodiment of the present invention. Undesired frequency peaks 510 and 520 have a maximum value of approximately −35 dB while distortion peak 530 has a value of approximately −85 dB. The difference in amplitude between undesired frequency peaks 510 and 520 and distortion peak 530 is approximately 50 dB, as compared to a difference of approximately 70 dB in the main differential amplifier (see FIGS. 3 and 4) without any cancellation applied. Assuming that the desired signal (not shown) has the same amplitude as undesired frequency peaks 510 and 520, the output of the cancellation differential amplifier generates a higher ratio of third order distortion to desired signal than does the main differential amplifier (see FIG. 4).

Figure 6:
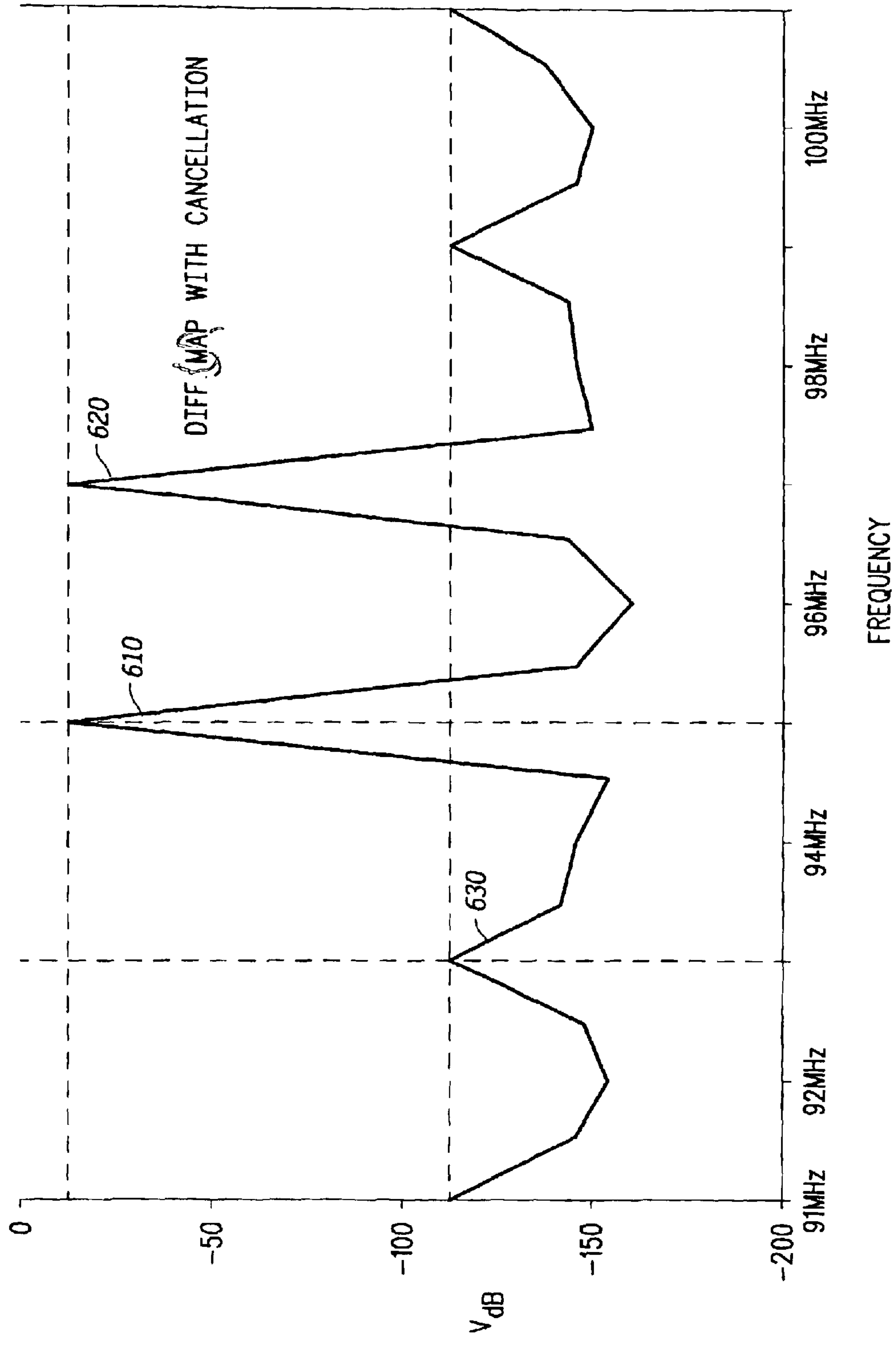
FIG. 6 is a graph showing the output of a voltage-to-current converter including a main differential amplifier cross-coupled to a cancellation differential amplifier according to an embodiment of the present invention.

Referring now to FIG. 6, the output of a voltage-to-current converter having a main differential amplifier cross-coupled with a cancellation amplifier is illustrated according to an embodiment of the present invention. FIG. 6 shows, in effect, the output of a cancellation amplifier illustrated in FIG. 5 subtracted from the output of a main amplifier shown in FIG. 4. For example, third order distortion 530 (FIG. 5), which is the output of a cancellation amplifier, is subtracted from third order distortion 430 (FIG. 4), which is the output of a main differential amplifier, to yield combined third order distortion 630. The magnitude of combined third order distortion 630 is approximately −115 dB, whereas the distortion of the main amplifier without a cancellation amplifier was approximately −85 dbs. As a result of cross coupling (in effect subtracting) the output of the cancellation amplifier from the output of the main amplifier, the third order distortion has been improved by approximately 30 db.

Note that the amplitude of frequency peaks 610 and 620 is approximately −15 dB, which is only about one dB less than the magnitude of frequency peaks 410 and 420 (FIG. 4). It is apparent, therefore, that by using the cancellation differential amplifier in the manner disclosed herein, the third order distortion of an output signal from a voltage to current converter, is significantly reduced, but there is no corresponding significant reduction in the output of other frequency peaks. Maintaining the assumption that the magnitude of the desired frequency peak (not shown) is approximately the same as the magnitude of the undesired frequency peaks 610 an 620, it should be clear that it will be much easier for subsequent circuitry to distinguish between the desired frequency peak (not shown) and third order distortion peak 630, than would have been otherwise possible.

In summary, by employing a voltage-to-current converter having a main differential amplifier with relatively high gain and biasing current cross-coupled to a cancellation amplifier having a lower gain and using much less biasing current, the distortion produced by the cancellation amplifier can be used to cancel out some of the distortion in the main amplifier without seriously degrading the amplitude of the desired signal.

In the preceding detailed description of the figures, reference has been made to the accompanying drawings which form a part thereof, and in which is shown by way of illustrations specific embodiments in which the invention may be practiced. These embodiments are described in sufficient detail to enable those skilled in the art to practice the invention, and it should be understood that other embodiments may be utilized and that logical, mechanical, chemical, and electrical changes may be made without departing from the spirit or scope of the present invention. To avoid detail not necessary to enable those skilled in the art to practice the invention, the description may omit certain information known to those skilled in the art. Furthermore, many other varied embodiments that incorporate the teaching of the invention may be easily constructed by those skilled in the art upon consideration of the teachings set forth herein. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A device comprising:

a first differential amplifier configured to have a first $g_m$ and to operate using a first amount of biasing current; and a second differential amplifier cross-coupled to said first differential amplifier, said second differential amplifier configured to have a second $g_m$ less than the first $g_m$ and to operate using a second amount of biasing current less than the first amount of biasing current.

2. The device as in claim 1, wherein:

said first differential amplifier generates a first output having a distortion component;

said second differential amplifier generates a second output having a distortion component; and the distortion component in said second output cancels out at least a portion of the distortion component in said first output.

3. The device as in claim 2, wherein the distortion components in said first output and the distortion components in said second output include third order non-linearities.

4. The device as in claim 1, wherein a ratio of the first $g_m$ to the second $g_m$ is between about 5:1 and about 15:1.

5. The device as in claim 4, wherein the ratio of the first $g_m$ to the second $g_m$ is about 10:1.

6. The device as in claim 1, wherein a ratio of the first amount of biasing current to the second amount of biasing current is between 8.5:1 and 37:1.

7. The device as in claim 6, wherein a ratio of the first amount of biasing current to the second amount of biasing current is about 20:1.

8. The device as in claim 1, wherein said device is a voltage-to-current converter.

9. The device as in claim 1, wherein said device is an FM radio receiver.

10. A voltage-to-current converter comprising:

a first differential amplifier having first differential outputs to provide differential output signals, said differential output signals including distortion components; and a second differential amplifier having second differential outputs cross-coupled to said first differential outputs such that distortion produced by said second differential amplifier cancels at least a portion of said distortion components in said differential output signals.

11. The voltage-to-current converter as in claim 10, wherein the distortion produced by said second differential amplifier cancels at least a portion of third order non-linearities in said differential output signals.

12. The voltage-to-current converter as in claim 10, wherein:

said first differential amplifier is configured to have a first $g_m$ and to operate using a first amount of biasing current; and said second differential amplifier is configured to have a second $g_m$ less than the first $g_m$ and to operate using a second amount of biasing current less than the first amount of biasing current.

13. The voltage-to-current converter as in claim 12, wherein a ratio of the first $g_m$ to the second $g_m$ is between 5:1 and 15:1.

14. The voltage-to-current converter as in claim 13, wherein the ratio of the first $g_m$ to the second $g_m$ is approximately 10:1.

15. The voltage-to-current converter as in claim 12, wherein a ratio of the first amount of biasing current to the second amount of biasing current is between 8.5:1 and 37:1.

16. The voltage-to-current converter as in claim 15, wherein a ratio of the first amount of biasing current to the second amount of biasing current is 20:1.

17. A method for use in a voltage to current converter, the method comprising the steps of:

producing a first output using a first differential amplifier, wherein the first output includes a first distortion component;

producing a second output using a second differential amplifier, wherein the second output includes a second distortion component; and cross coupling the second output to the first output such that second distortion component cancels at least a portion of the first distortion component.

18. The method as in claim 17, wherein the second distortion component cancels at least a portion of third order non-linearities in the first output.

19. The method as in claim 17, wherein:

the first differential amplifier is configured to have a first $g_m$ and to operate using a first amount of biasing current; and the second differential amplifier is configured to have a second $g_m$ less than the first $g_m$ and to operate using a second amount of biasing current less than the first amount of biasing current.

20. The method as in claim 19, wherein a ratio of the first $g_m$ to the second $g_m$ is between 5:1 and 15:1.

21. The device as in claim 20, wherein the ratio of the first $g_m$ to the second $g_m$ is 10:1.

22. The device as in claim 19, wherein a ratio of the first amount of biasing current to the second amount of biasing current is between 8.5:1 and 37:1.

23. The device as in claim 22, wherein a ratio of the first amount of biasing current to the second amount of biasing current is 20:1.

24. An apparatus comprising:

a first differential amplifier configured to have a first $g_m$ and further configured to operate using a first amount of reference current, said first differential amplifier including:
- a non-inverting input;
- an inverting input;
- a non-inverting output;
- an inverting output; and a second differential amplifier configured to have a second $g_m$ less than said first $g_m$ and further configured to operate using a second amount of reference current less than said first amount of reference current, said second differential amplifier including:
- an non-inverting input coupled to said non-inverting input of the first differential amplifier;
- an inverting input coupled to said inverting input of the first differential amplifier;
- an non-inverting output coupled to said inverting output of the first differential amplifier;
- an inverting output coupled to said non-inverting output of the first differential amplifier.

25. The apparatus as in claim 24, wherein a ratio of said first $g_m$ to said second $g_m$ is between 5:1 and 15:1.

26. The apparatus as in claim 25, wherein said ratio of said first $g_m$ to said second $g_m$ is 10:1.

27. The apparatus as in claim 24, wherein a ratio of the first amount of biasing current to the second amount of biasing current is between 8.5:1 and 37:1.

28. The apparatus as in claim 27, wherein a ratio of said first amount of reference current to the second amount of biasing current is 20:1.

29. The apparatus as in claim 24, wherein said apparatus is a voltage to current converter.

30. The apparatus as in claim 24, wherein said inverting output and said non-inverting output are coupled to a mixer.

31. The apparatus as in claim 24, wherein said inverting input and said non-inverting input are coupled to an output of an RF filter.

32. The apparatus as in claim 24, wherein said apparatus is an FM radio receiver.

* * * * *